(12) United States Patent
Chen et al.

(10) Patent No.: US 6,664,194 B1
(45) Date of Patent: Dec. 16, 2003

(54) PHOTOEXPOSURE METHOD FOR FACILITATING PHOTORESIST STRIPPING

(75) Inventors: Dian-Hau Chen, Hsinchu (TW); Chiang-Jen Peng, Hsin-Chu (TW); Wei-Kay Chiu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 409 days.

(21) Appl. No.: 09/270,588

(22) Filed: Mar. 18, 1999

(51) Int. Cl.[7] ............................................. H01L 21/306
(52) U.S. Cl. ........................ 438/745; 438/949; 216/48
(58) Field of Search ................................ 438/745, 949; 216/48; 510/176

(56) References Cited

U.S. PATENT DOCUMENTS

| | | | | |
|---|---|---|---|---|
| 3,664,899 A | * | 5/1972 | Wright et al. ................ 216/48 |
| 4,105,450 A | * | 8/1978 | Shinozaki et al. .......... 430/193 |
| 4,645,562 A | * | 2/1987 | Liao et al. .................. 438/640 |
| 5,380,608 A | * | 1/1995 | Miyashita et al. ............. 430/5 |
| 5,407,786 A | * | 4/1995 | Ito et al. ..................... 430/313 |
| 5,496,438 A | | 3/1996 | Wootton et al. ......... 156/643.1 |
| 5,503,964 A | | 4/1996 | Nishina et al. ............. 430/329 |
| 5,591,654 A | | 1/1997 | Kishimura .................... 437/26 |
| 5,651,860 A | | 7/1997 | Li .......................... 156/659.11 |
| 5,770,523 A | | 6/1998 | Hung et al. ................. 438/725 |
| 5,994,007 A | * | 11/1999 | Sato et al. .................... 430/22 |

* cited by examiner

Primary Examiner—Nadine G. Norton
Assistant Examiner—Binh Tran
(74) Attorney, Agent, or Firm—George O. Saile; Stephen B. Ackerman; Stephen G. Stanton

(57) ABSTRACT

There is first provided a substrate 10 and a target layer 12. There is then formed upon the target layer a patterned positive photoresist layer 14. There is then processed the target layer while employing the patterned positive photoresist layer as a mask layer, to thus form a processed target layer and a processed patterned positive photoresist layer. There is then photoexposed 18 the processed patterned positive photoresist layer to enhance its solubility. Finally, there is then stripped from the processed target layer the photoexposed processed patterned positive photoresist layer while employing a solvent.

34 Claims, 3 Drawing Sheets

PHOTOEXPOSURE METHOD FOR FACILITATING PHOTORESIST STRIPPING

BACKGROUND OF THE INVENTION

1. Field of the Invention

The present invention relates generally to methods for stripping photoresist layers employed within microelectronics fabrications. More particularly, the present invention relates to methods for facilitating stripping of photoresist layers employed within microelectronics fabrications.

2. Description of the Related Art

Microelectronics fabrications are formed from microelectronics substrates over which are formed patterned microelectronics conductor layers which are separated by microelectronics dielectric layers.

In the process of forming microelectronics devices and patterned microelectronics layers, such as but not limited to patterned microelectronics conductor layers, within microelectronics fabrications, it is common in the art of microelectronics fabrication to employ patterned photoresist layers as mask layers for forming those microelectronics devices and patterned microelectronics layers from corresponding blanket microelectronics layers.

While the use of patterned photoresist layers as mask layers when forming microelectronics devices and patterned microelectronics layers from corresponding blanket microelectronics layers within microelectronics fabrications is thus quite common in the art of microelectronics fabrication, the use of patterned photoresist layers as mask layers when forming microelectronics devices and patterned microelectronics layers from corresponding blanket microelectronics layers within microelectronics fabrications is not without problems within the art of microelectronics fabrication. Specifically, it is common in the art of microelectronics fabrication for patterned photoresist layers which have been employed as mask layers for forming microelectronics devices and patterned microelectronics layers from corresponding blanket microelectronics layers often to be particularly difficult to strip from a microelectronics device or patterned microelectronics layer whose fabrication is facilitated employing the patterned photoresist layer. Typical microelectronics fabrication processes which provide patterned photoresist layers which are difficult to strip include but are not limited to reactive ion etch (RIE) plasma etch processes and ion implantation processes.

It is thus towards the goal of providing within the art of microelectronics fabrication methods which facilitate stripping of patterned photoresist layers, and particularly methods which facilitate stripping of patterned photoresist layers which have been employed as mask layers for forming microelectronics devices and patterned microelectronics layers from corresponding blanket microelectronics layers within microelectronics fabrications, that the present invention is directed.

Various methods have been disclosed in the art of microelectronics fabrication for forming and stripping patterned photoresist layers which may be employed as mask layers for fabricating microelectronics devices and patterned microelectronics layers within microelectronics fabrications.

For example, Wooton et al., in U.S. Pat. No. 5,496,438, discloses a method for stripping from a patterned metal layer within a microelectronics fabrication, while not staining the patterned metal layer, a patterned photoresist layer employed as a patterned photoresist etch mask layer when forming the patterned metal layer from a blanket metal layer while employing a reactive ion etch (RIE) plasma etch method which employs a corrosive etchant gas composition. Within the method, the patterned photoresist layer is stripped within an oxygen gas plasma for a period of time and at a sufficiently high temperature such that substantially all of the residual corrosive gas absorbed within the patterned photoresist layer is removed, but where the temperature is below a temperature at which the patterned metal layer begins to flow.

In addition, Nishina et al., in U.S. Pat. No. 5,503,964, discloses an oxygen containing plasma stripping method for stripping from a semiconductor substrate a patterned photoresist layer which is employed as a patterned photoresist ion implantation mask layer for forming an ion implanted region within the semiconductor substrate, where the oxygen containing plasma stripping method is employed without use of a reducing material, such as hydrogen, within the oxygen containing plasma stripping method. The method employs an ultraviolet radiation hardening of the patterned photoresist layer prior to employing the ultraviolet radiation hardened patterned photoresist layer as the patterned ion implantation mask layer, where the ultraviolet radiation hardening precludes formation within the ultraviolet radiation hardened patterned photoresist layer of ion implanted species whose removal would otherwise typically be effected with use of the reducing material.

Further, Kishimura, in U.S. Pat. No. 5,591,654, discloses a method for fabricating a patterned photoresist layer with enhanced dimensional integrity when employed as a patterned photoresist ion implantation mask layer within a semiconductor integrated circuit microelectronics fabrication. The method employs a thermal baking of a photoexposed blanket photoresist layer from which is formed the pattered photoresist layer prior to developing the photoexposed blanket photoresist layer to form the patterned photoresist layer, as well as a thermal baking of the patterned photoresist layer immediately after being developed from the photoexposed blanket photoresist layer.

Still further, Li, in U.S. Pat. No. 5,651,860, discloses a method for stripping from a semiconductor integrated circuit microelectronics fabrication a patterned photoresist layer which was employed as a patterned photoresist ion implantation mask layer for forming an ion implanted region within the semiconductor substrate. The method employs a hydrogenation of the patterned photoresist layer to form a hydrogenated patterned photoresist layer, prior to stripping from the microelectronics fabrication the hydrogenated ion implanted patterned photoresist layer through use of a conventional method.

Finally, Hung et al., in U.S. Pat. No. 5,770,523, discloses a method for stripping from a patterned metal layer within a microelectronics fabrication a patterned photoresist layer employed as a reactive ion etch (RME) plasma etch mask layer for forming the patterned metal layer. The method first employs stripping from the patterned photoresist layer a surface layer of the patterned photoresist layer within a plasma employing fluorine containing gases under conditions sufficient such that the remainder of the patterned photoresist layer may be stripped employing an oxygen containing plasma stripping method.

Desirable in the art of microelectronics fabrication are additional methods and materials which may be employed to strip patterned photoresist layers formed within microelectronics fabrications. More particularly desirable in the art of microelectronics fabrication are additional methods and materials which may be employed to strip patterned photoresist layers within microelectronics fabrications, where the patterned photoresist layers have been employed as patterned photoresist etch mask layers and patterned photoresist ion implantation mask layers.

It is towards the foregoing objects that the present invention is both generally and more specifically directed.

SUMMARY OF THE INVENTION

A first object of the present invention is to provide a method for stripping from a microelectronics fabrication a patterned photoresist layer.

A second object of the present invention is to provide a method in accord with the first object of the present invention, where the patterned photoresist layer is employed as a patterned photoresist etch mask layer for forming a patterned layer within the microelectronics fabrication.

A third object of the present invention is to provide a method in accord with the first object of the present invention, where the patterned photoresist layer is employed as a patterned photoresist ion implantation mask layer for forming an ion implanted region within an ion implanted layer formed beneath the patterned photoresist layer.

A fourth object of the present invention is to provide a method in accord with the first object of the present invention, the second object of the present invention or the third object of the present invention, which method is readily commercially implemented.

In accord with the objects of the present invention, there is provided a method for stripping from a microelectronics fabrication a patterned photoresist layer. To practice the method of the present invention, there is first provided a substrate. There is then formed over the substrate a target layer. There is then formed upon the target layer a patterned positive photoresist layer. There is then processed the target layer while employing the patterned positive photoresist layer as a mask layer to thus form from the target layer a processed target layer and to form from the patterned positive photoresist layer a processed patterned positive photoresist layer. There is then photoexposed the processed patterned positive photoresist layer to form a photoexposed processed patterned positive photoresist layer with enhanced solubility of the photoexposed processed patterned positive photoresist layer within a solvent. Finally, there is then stripped from the processed target layer the photoexposed processed patterned positive photoresist layer while employing the solvent.

There is provided by the present invention a method for stripping from a microelectronics fabrication a patterned photoresist layer. The method of the present invention realizes the forgoing object by employing when stripping the patterned photoresist layer in accord with the present invention a patterned positive photoresist layer which is employed as a mask layer when processing a target layer formed beneath the patterned positive photoresist layer. A processed patterned positive photoresist layer formed from the patterned positive photoresist layer incident to processing the target layer is then photoexposed to form a photoexposed processed patterned positive photoresist layer which exhibits an enhanced solubility within a solvent which is then employed to strip the photoexposed processed patterned positive photoresist layer from the processed target layer.

The present invention may be employed where: (1) the patterned photoresist layer is employed as a patterned photoresist etch mask layer for forming a patterned layer within a microelectronics fabrication; or (2) the patterned photoresist layer is employed as a patterned photoresist ion implantation mask layer for forming an ion implanted region within an ion implanted layer formed beneath the patterned photoresist layer. The present invention does not discriminate with respect to the use of a patterned photoresist layer with respect to whether the patterned photoresist layer is employed as a patterned photoresist etch mask layer or as a patterned photoresist ion implantation mask layer within a microelectronics fabrication. Thus, provided that the patterned photoresist layer is a patterned positive photoresist layer which is susceptible to an increase in solubility within a solvent when photoexposed to form a photoexposed processed patterned positive photoresist layer, the patterned photoresist layer may be formed as a mask layer including but not limited to a patterned photoresist etch mask layer or a patterned photoresist ion implantation mask layer when processing various types of target layers formed beneath the patterned photoresist layer.

The method of the present invention is readily commercially implemented. The present invention employs methods and materials as are otherwise generally known in the art of microelectronics fabrication. Since it is a process ordering and process control within the present invention which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for stripping a patterned photoresist layer from a microelectronics fabrication. The present invention realizes the foregoing object by employing as the patterned photoresist layer a patterned positive photoresist layer which after being employed in processing a target layer formed beneath the patterned positive photoresist layer is photoexposed to form a photoexposed patterned positive photoresist layer which is susceptible to stripping within a solvent. The photoexposed patterned positive photoresist layer is then stripped within the solvent.

The present invention may be employed to strip from processed target layers processed patterned positive photoresist layers within microelectronics fabrications including but not limited to semiconductor integrated circuit microelectronics fabrications, solar cell microelectronics fabrications, ceramic substrate microelectronics fabrications and flat panel display microelectronics fabrications. When forming the processed target layers within the microelectronics fabrications the patterned positive photoresist layers may be employed as mask layers including but not limited to patterned photoresist reactive ion etch (RIE) plasma etch mask layers and patterned photoresist ion implantation mask layers. Although of possibly lesser utility within the present invention, the present invention may also be employed for stripping from microelectronics fabrications photoresist layers which have not been employed as mask layers for forming processed layers within microelectronics fabrications.

First Preferred Embodiment

Figure 1:
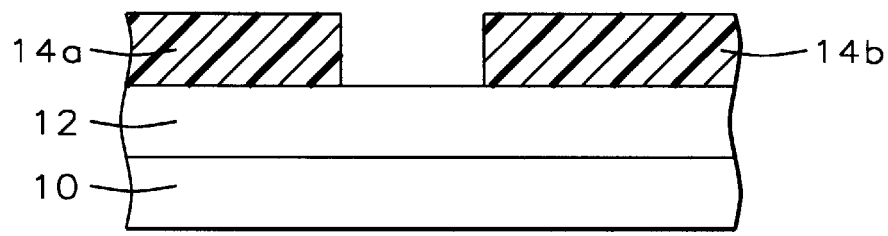
FIG. 1, FIG. 2, FIG. 3 and FIG. 4 show a series of schematic cross-sectional diagrams illustrating the results of forming within a microelectronics fabrication in accord with a first preferred embodiment of the present invention a pair of patterned target layers while employing the present invention.

Referring now to FIG. 1 to FIG. 4, there is shown a series of schematic cross-sectional diagrams illustrating the results of forming in accord with a first preferred embodiment of the present invention a patterned microelectronics layer within a microelectronics fabrication while employing the present invention. Shown in FIG. 1 is a schematic cross-sectional diagram of the microelectronics fabrication at an early stage in its fabrication in accord with the present invention.

Shown in FIG. 1 is a substrate 10 having formed thereupon a target layer 12 which in turn has formed thereupon a pair of patterned photoresist layers 14a and 14b. Within the first preferred embodiment of the present invention, the substrate 10 may be a substrate employed within a microelectronics fabrication selected from the group including but not limited to semiconductor integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be a substrate alone as employed within the microelectronics fabrication, or in the alternative, the substrate 10 may be the substrate employed within the microelectronics fabrication, where the substrate has any of several additional layers formed thereupon or thereover as are conventional within the microelectronics fabrication within which is employed the substrate 10. Such additional microelectronics layers may include, but are not limited to, microelectronics conductor layers, microelectronics semiconductor layers and microelectronics dielectric layers.

Within the first preferred embodiment of the present invention with respect to the target layer 12, the target layer 12 may be formed from any of several materials as are conventional in the art of microelectronics fabrication, such materials including but not limited to conductor materials, semiconductor materials and dielectric materials. Typically and preferably, the target layer 12 is formed to a thickness of from about 1000 to about 15000 angstroms.

Figure 9:
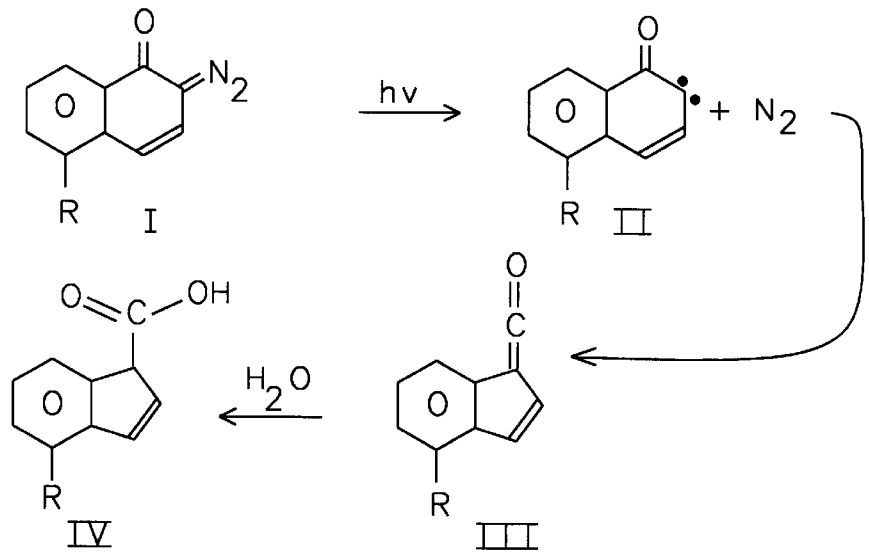
FIG. 9 shows as chemical equation which governs photochemical decomposition of a solubilizing agent which may be employed within a positive photoresist material which may be employed for forming a patterned positive photoresist layer employed within the present invention.

Finally, within the first preferred embodiment of the present invention with respect to the patterned photoresist layers 14a and 14b, the patterned photoresist layers 14a and 14b are formed of a positive photoresist material. Any of several positive photoresist materials may be employed for forming the patterned photoresist layers 14a and 14b within the first preferred embodiment of the present invention, such positive photoresist materials being selected from the group including but not limited to novolak positive photoresist materials and polymethylmethacrylate (PMMA) positive photoresist materials. Such positive photoresist materials may be solubilized employing photoactive solubilizing agents appropriate to a specific individual positive photoresist material. A specific, but by no means exclusive photoactive agent, and its decomposition pathway and products, are illustrated within the chemical equation of FIG. 9. Shown in FIG. 9 as compound I is a diazo material which upon photoexposure forms compound II, which is a diradical, along with nitrogen. Compound II, the diradical, then rearranges to form compound III, which is a ketene, and compound III, the ketene, upon hydrolysis forms compound IV, which is a carboxylic acid. Compound IV may impart solubility to a positive photoresist material via several mechanisms, including mechanisms based upon acid induced scission of chemical bonds within the positive photoresist material, as well as mechanisms based upon enhanced permeability of a photoresist developer solution, such as an amine based photoresist developer solution, into a photoexposed acidified region of a positive photoresist material. Preferably, the patterned photoresist layers 14a and 14b are formed to a thickness of from about 2000 to about 15000 angstroms, from a polymethylmethacrylate (PMMA) photoresist material.

Figure 2:
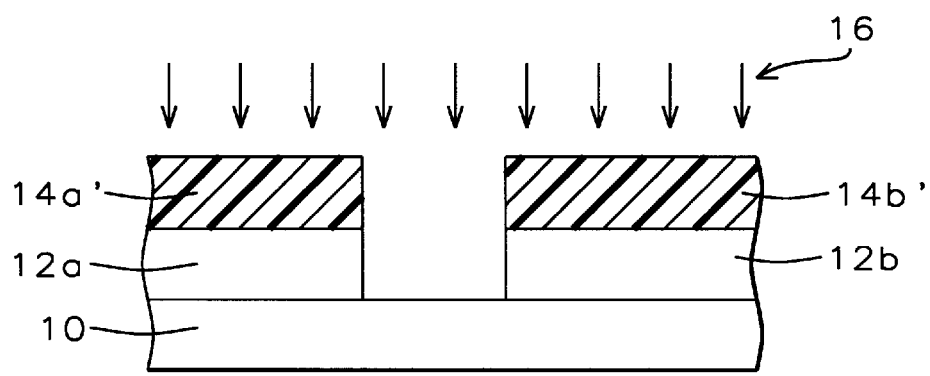

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the target layer 12 has been patterned to form a pair of patterned target layers 12a and 12b, through etching within an etch plasma 16, while employing the pair of patterned photoresist layers 14a and 14b as a pair of patterned photoresist reactive ion etch (RIE) plasma etch mask layers. As is illustrated within the schematic cross-sectional diagram of FIG. 2, upon exposure to the etching plasma 16 incident to etching the target layer 12 to form the pair of patterned target layers 12a and 12b, the pair of patterned photoresist layers 14a' and 14b' is processed to form a pair of etch plasma processed patterned photoresist layers 14a' and 14b'. Within FIG. 2, the etch plasma 16 is formed employing methods and materials as are appropriate to the material from which is formed the target layer 12.

Such processing within the etch plasma 16 of the pair of patterned photoresist layers 14a and 14b to form the pair of etch plasma processed patterned photoresist layers 14a' and 14b' typically provides the pair of etch plasma processed patterned photoresist layers 14a' and 14b' which are often difficult to easily remove from the microelectronics fabrication whose schematic cross-sectional diagram is illustrated in FIG. 2 while employing photoresist stripping methods. In particular, etch plasma processed patterned photoresist layers which have been employed to etch into or through target layers, such as dielectric target layers, while employing reactive ion etch (REE) plasma etch methods employing fluorine (such as fluorocarbon) containing etchant gas compositions, to provide etch plasma processed patterned photoresist layers of substantial areal density (greater than about 50 percent areal density) of a microelectronics fabrication surface, are often particularly difficult to effectively strip from the surface of the microelectronics fabrication.

Figure 3:
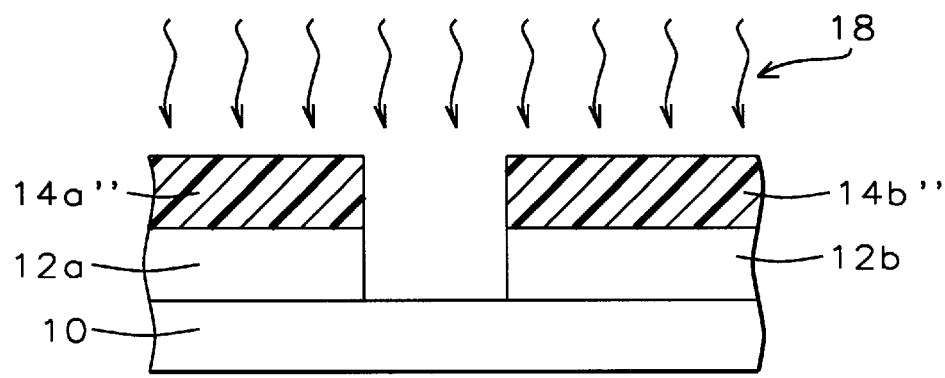

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the pair of etch plasma processed patterned photoresist layers 14a' and 14b' has been treated within a photoexposure 18 to form from the pair of etch plasma processed patterned photoresist layers 14a' and 14b' a pair of photoexposed etch plasma processed patterned photoresist layers 14a" and 14b".

Within the first preferred embodiment of the present invention, the photoexposure 18 may be provided at a photoexposure wavelength analogous or equivalent to the photoexposure wavelength employed for photoexposing a corresponding blanket photoresist layer from which is formed the pair of patterned photoresist layers 14a and 14b as illustrated within the schematic cross-sectional diagram of FIG. 1, although multiple photoexposure wavelength flood exposure methods may also be employed in photoexposing the etch plasma processed patterned photoresist layers 14a' and 14b' to form the photoexposed etch plasma processed patterned photoresist layers 14a" and 14b". Typically and preferably, the photoexposure 18 is provided as a flood ultraviolet photoexposure employing an about 100 to about 1000 watt mercury lamp all of whose radiant output is focused onto an eight inch diameter substrate 10 for a photoexposure time period of from about 1 to about 100 seconds.

Figure 4:
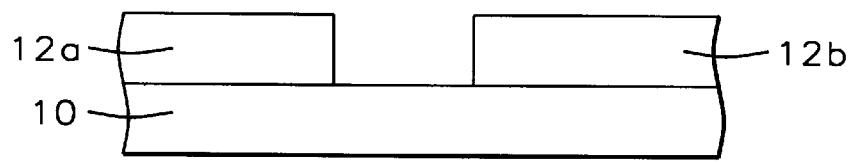

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein the pair of photoexposed etch plasma processed patterned photoresist layers 14a" and 14b" has been stripped from the pair of pair of patterned target layers 12a and 12b.

Within the first preferred embodiment of the present invention the pair of photoexposed etch plasma processed patterned photoresist layers 14a" and 14b" may be stripped from the surface of the corresponding pair of patterned target layers 12a and 12b employing either: (1) a photoresist stripper solution as is conventional in the art of microelectronics fabrication, such photoresist stripper solution including but not limited to an organic solvent stripper solution employing an organic solvent such as but not limited to acetone, N-methylpyrrolidone (NWP) or tetrahydrofuran (THF) (possibly with an additional amine component such as ethanolamine); or (2) a photoresist developer solution analogous or equivalent to the photoresist developer solution employed for developing from a corresponding photoexposed blanket photoresist layer the pair of patterned photoresist layers 14a and 14b as illustrated within the schematic cross-sectional diagram of FIG. 1. Such a photoresist developer solution may include, but is not limited to, a tetramethylammoniumhydroxide (TMAH) component. Typically and preferably, the photoexposed etch plasma processed patterned photoresist layers 14a" and 14b" are stripped employing an aqueous ethanolamine based photoresist stripper solution at a temperature of from about 5 to about 50 degrees centigrade for an immersion time period of from about 1 to about 3 minutes.

When forming the microelectronics fabrication whose schematic cross-sectional diagram is illustrated in FIG. 4, there is stripped from the patterned target layers 12a and 12b the photoexposed etch plasma processed patterned photoresist layers 14a" and 14b" as illustrated within the schematic cross-sectional diagram of FIG. 3 more readily than the corresponding etch plasma processed patterned photoresist layers 14a' and 14b' as illustrated within the schematic cross-sectional diagram of FIG. 2. The greater facility with which the photoexposed etch plasma processed patterned photoresist layers 14a" and 14b" may be stripped from the pair of patterned target layers 12a and 12b derives from an increase in solubility of the pair of photoexposed etch plasma processed patterned photoresist layers 14a" and 14b" within a stripper solution or a photoresist developer solution incident to their photoexposure treatment.

In order to provide optimal surface cleanliness to the microelectronics fabrication whose schematic cross-sectional diagram is illustrated in FIG. 4, the microelectronics fabrication whose schematic cross-sectional diagram is illustrated in FIG. 4 may optionally be additionally treated employing an oxygen containing plasma stripping method. Under such circumstances, the oxygen containing plasma stripping method will typically employ: (1) a reactor chamber pressure of from about 0.1 to about 100 torr; (2) a radio frequency power of from about 500 to about 3000 watts at a radio frequency of 13.56 MHZ; (3) a substrate 10 temperature of from about 100 to about 300 degrees centigrade; and (4) an oxygen flow rate of from about 500 to about 5000 standard cubic centimeters per minute (sccm), for oxygen plasma treating an eight inch diameter substrate.

Second Embodiment

Figure 5:
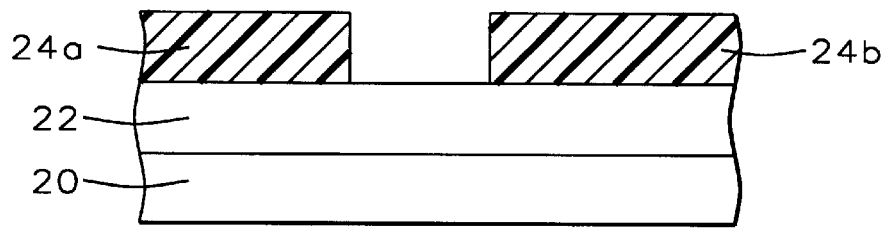
FIG. 5, FIG. 6, FIG. 7 and FIG. 8 show a series of schematic cross-sectional diagrams illustrating the results of forming within a microelectronics fabrication in accord with a second preferred embodiment of the present invention an ion implanted target layer while employing the present invention.

Referring now to FIG. 5 to FIG. 8, there is shown a series of schematic cross-sectional diagrams illustrating the results of progressive stages in forming in accord with a second preferred embodiment of the present invention an ion implanted target layer within a microelectronics fabrication. Shown in FIG. 5 is a schematic cross-sectional diagram of the microelectronics fabrication at an early stage in its fabrication in accord with the second preferred embodiment of the present invention.

Shown in FIG. 5 is a substrate 20 having formed thereupon a blanket ion implantable layer 22 in turn having formed thereupon a pair of patterned photoresist layers 24a and 24b.

Within the second preferred embodiment of the present invention, the substrate 20 is analogous or equivalent to the substrate 10 employed within the first preferred embodiment of the present invention as illustrated in FIG. 1. Similarly, although the ion implantable layer 22 as illustrated within the schematic cross-sectional diagram of FIG. 5 may be formed employing methods and materials analogous or equivalent to the methods and materials employed in forming the target layer 12 within the first preferred embodiment of the present invention as illustrated within the schematic cross-sectional diagram of FIG. 1, the ion implantable layer 22 will typically and preferably be formed of a monocrystalline silicon material or a polycrystalline silicon material such that upon ion implantation there is formed within the monocrystalline silicon ion implantable layer 22 or polycrystalline silicon ion implantable layer 22 a region of enhanced conductivity.

Finally, with respect to the patterned photoresist layers 24a and 24b, the patterned photoresist layers 24a and 24b are typically and preferably formed employing methods and materials analogous or equivalent to the methods and materials employed for forming the pair of patterned photoresist layers 14a and 14b within the first preferred embodiment of the present invention as illustrated within the schematic cross-sectional diagram of FIG. 1.

Figure 6:
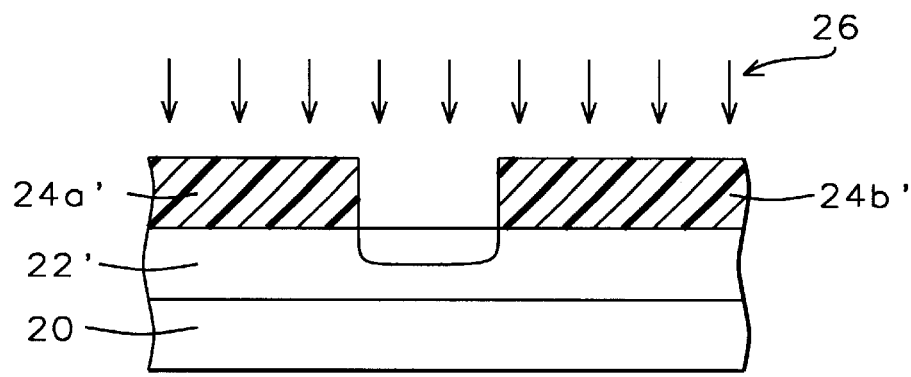

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the ion implantable layer 22 has been ion implanted to form an ion implanted ion implantable layer 22' through exposure to a dose of implanting ions 26. Incident to forming from the ion implantable layer 22 the ion implanted ion implantable layer 22' through exposure to the dose of implanting ions 26, there is also formed from the pair of patterned photoresist layers 24a and 24b a pair of ion implant processed patterned photoresist layers 24a' and 24b'. Similarly with the etch plasma processed patterned photoresist layers 14a' and 14b' as illustrated within the schematic cross-sectional diagram of FIG. 1, the ion implant processed patterned photoresist layers 24a' and 24b' as illustrated within the schematic cross-sectional diagram of FIG. 6 are also typically difficult to strip from a microelectronics fabrication. Typically and preferably, the dose of implanting ions 26 is provided at an ion implantation dose of from about 1E10 to about 1E15 ions per square centimeter and an ion implantation energy of from about 10 to about 5000 kev, while typically employing an electrically active dopant as is conventional in the art of microelectronics fabrication. Such electrically active dopants include, but are not limited to boron containing dopants, phosphorus containing dopants and arsenic containing dopants.

Figure 7:
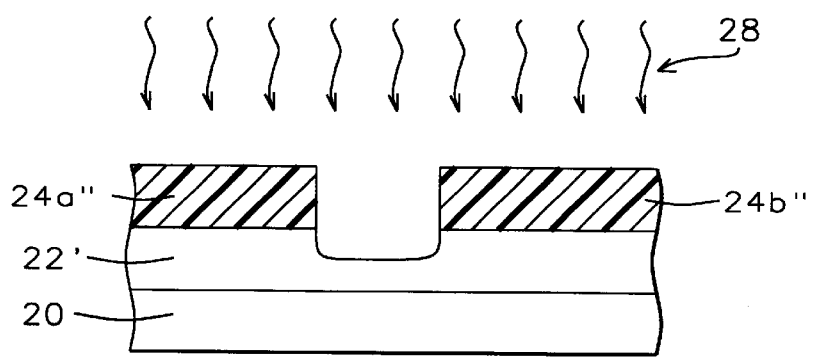

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the ion implant processed patterned photoresist layers 24a' and 24b' have been treated with a photoexposure 28 to form a pair of photoexposed ion implant processed patterned photoresist layers 24a" and 24b".

Within the second preferred embodiment of the present invention, the photoexposure 28 which is employed for forming from ion implant processed patterned photoresist layers 24a' and 24b' as illustrated within the schematic cross-sectional diagram of FIG. 6 the photoexposed ion implant processed patterned photoresist layers 24a" and 24b" as illustrated within the schematic cross-sectional diagram of FIG. 7 is analogous or equivalent to the photoexposure 18 which is employed within the first preferred embodiment of the present invention for forming from the etch plasma processed patterned photoresist layers 14a' and 14b' as illustrated within the schematic cross-sectional diagram of FIG. 2 the photoexposed etch plasma processed patterned photoresist layers 14a" and 14b" as illustrated within the schematic cross-sectional diagram of FIG. 3.

Figure 8:
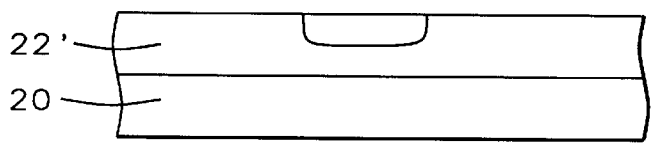

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein there is stripped from the microelectronics fabrication the pair of photoexposed ion implant processed patterned photoresist layers 24a" and 24b".

Within the second preferred embodiment of the present invention, the photoexposed ion implant processed patterned photoresist layers 24a" and 24b" as illustrated within the microelectronics fabrication whose schematic cross-sectional diagram is illustrated in FIG. 7 may be stripped to provide the microelectronics fabrication whose schematic cross-sectional diagram is illustrated in FIG. 8 employing stripping methods and materials analogous or equivalent to the stripping methods and materials employed for stripping from the microelectronics fabrication whose schematic cross-sectional diagram is illustrated in FIG. 3 the photoexposed etch plasma processed patterned photoresist layers 14a" and 14b" to provide the microelectronics fabrication whose schematic cross-sectional diagram is illustrated in FIG. 4.

Upon forming the microelectronics fabrication whose schematic cross-sectional diagram is illustrated in FIG. 8, there is formed a microelectronics fabrication from whose surface has been stripped a pair of ion implant processed patterned positive photoresist layers with enhanced facility. The pair of ion implant processed patterned positive photoresist layers is stripped with enhanced facility due to the use of a photoexposure treatment of the pair of ion implant processed patterned photoresist layers prior to stripping the pair of photoexposed ion implant processed patterned photoresist layers within a solvent.

As is understood by a person skilled in the art, the preferred embodiments of the present invention are illustrative of the present invention rather than limiting of the present invention. Revisions and modifications may be undertaken to methods, materials, structures and dimensions through which are provided the microelectronics fabrications in accord with the preferred embodiments of the present invention while still providing microelectronics fabrications in accord with the present invention, as defined by the appended claims.

What is claimed is:

1. A method for stripping a patterned photoresist layer comprising:

providing a substrate;

forming over the substrate a target layer;

forming upon the target layer a patterned positive photoresist layer, processing the target layer while employing the patterned positive photoresist layer as a mask layer to thus form from the target layer a processed target layer and to form from the patterned positive photoresist layer a processed patterned positive photoresist layer;

photoexposing the processed patterned positive photoresist layer to form a photoexposed processed patterned positive photoresist layer with enhanced solubility of the photoexposed processed patterned positive photoresist layer within a solvent; and stripping from the processed target layer the photoexposed processed patterned positive photoresist layer while employing the solvent.

2. The method of claim 1 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

3. The method of claim 1 wherein the target layer is formed from a material selected from the group consisting of conductor materials, semiconductor materials and dielectric materials.

4. The method of claim 1 wherein:
the target layer is processed employing a processing method selected from the group consisting of plasma etch processing methods and ion implant processing methods; and
the processed patterned positive photoresist layer is selected from the corresponding group consisting of plasma etch processed patterned positive photoresist layers and ion implant processed patterned positive photoresist layers.

5. The method of claim 1 wherein the solvent is selected from the group consisting of photoresist developer solutions and photoresist stripper solutions.

6. The method of claim 1 wherein:
the patterned positive photoresist layer is formed of a polymethylmethacrylate (PMMA) photoresist material; and
the solvent is an aqueous ethanolamine solvent.

7. The method of claim 1, wherein the positive photoresist layer is a material selected from the group consisting of novolak positive photoresist material and polymethylmethacrylate (PMMA) positive photoresist material.

8. The method of claim 1, wherein the positive photoresist material includes a diazo material photoreactive agent Compound I of FIG. 9 that forms a diradical Compound II of FIG. 9 upon the photoexposing step of the processed patterned positive photoresist layer and rearranges to form Compound III of FIG. 9 plus $N_2$; and the Compound III of FIG. 9, upon hydrolysis, forms the carboxylic acid Compound IV of FIG. 9.

9. The method of claim 1, wherein the solvent is selected from the group consisting of a photoresist stripper solution and a photoresist developer solution.

10. The method of claim 1, wherein the solvent is selected from the group consisting of acetone, NMP, THF, and a photoresist developer solution having a TMAH component.

11. The method of claim 1, wherein the photoexposed processed patterned positive photoresist layer stripping step employs an aqueous ethanolamine based photoresist stripper solution at a temperature from about 5 to 50° C. for from about 1 to 3 minutes immersion time.

12. The method of claim 1, including the step of treating the structure with an oxygen containing plasma stripper after the solvent stripping step to provide optimal surface cleanliness.

13. The method of claim 1, including the step of treating the structure with an oxygen containing plasma stripper after the solvent stripping step to provide optimal surface cleanliness; the oxygen containing plasma stripping step employing a reactor chamber pressure of from about 0.1 to about 100 Torr; a radio frequency power of from about 500 to about 3000 watts at a radio frequency of 13.56 MHz; a substrate temperature of from about 100 to about 300° C.; and an oxygen flow rate of from about 500 to about 5000 sccm treating an eight inch diameter substrate.

14. A method for stripping a patterned photoresist layer comprising:
providing a substrate;
forming over the substrate a target layer;
forming upon the target layer a patterned positive photoresist layer; the positive photoresist layer is a material selected from the group consisting of novolak positive photoresist material and polymethylmethacrylate (PMMA) positive photoresist material;
processing the target layer while employing the patterned positive photoresist layer as a mask layer to thus form from the target layer a processed target layer and to form from the patterned positive photoresist layer a processed patterned positive photoresist layer;
photoexposing the processed patterned positive photoresist layer to form a photoexposed processed patterned positive photoresist layer with enhanced solubility of the photoexposed processed patterned positive photoresist layer within a solvent; and
stripping from the processed target layer the photoexposed processed patterned positive photoresist layer while employing the solvent.

15. The method of claim 14, wherein the positive photoresist material includes a diazo material photoreactive agent Compound 1 of FIG. 9 that forms a diradical Compound II of FIG. 9 upon the photoexposing step of the processed patterned positive photoresist layer and rearranges to form Compound III of FIG. 9 plus $N_2$; and the Compound III of FIG. 9, upon hydrolysis, forms the carboxylic acid Compound IV of FIG. 9.

16. The method of claim 14, wherein the solvent is selected from the group consisting of a photoresist stripper solution and a photoresist developer solution.

17. The method of claim 14, wherein the solvent is selected from the group consisting of acetone, NMP, THF, and a photoresist developer solution having a TMAH component.

18. The method of claim 14, wherein the photoexposed processed patterned positive photoresist layer stripping step employs an aqueous ethanolamine based photoresist stripper solution at a temperature from about 5 to 50° C. for from about 1 to 3 minutes immersion time.

19. The method of claim 14, including the step of treating the structure with an oxygen containing plasma stripper after the solvent stripping step to provide optimal surface cleanliness.

20. The method of claim 14, including the step of treating the structure with an oxygen containing plasma stripper after the solvent stripping step to provide optimal surface cleanliness; the oxygen containing plasma stripping step employing a reactor chamber pressure of from about 0.1 to about 100 Torr; a radio frequency power of from about 500 to about 3000 watts at a radio frequency of 13.56 MHz; a substrate temperature of from about 100 to about 300° C.; and an oxygen flow rate of from about 500 to about 5000 sccm treating an eight inch diameter substrate.

21. The method of claim 14 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

22. The method of claim 14 wherein the target layer is formed from a material selected from the group consisting of conductor materials, semiconductor materials and dielectric materials.

23. The method of claim 14 wherein:
the target layer is processed employing a processing method selected from the group consisting of plasma etch processing methods and ion implant processing methods; and
the processed patterned positive photoresist layer is selected from the corresponding group consisting of plasma etch processed patterned positive photoresist layers and ion implant processed patterned positive photoresist layers.

24. The method of claim 14 wherein the solvent is selected from the group consisting of photoresist developer solutions and photoresist stripper solutions.

25. The method of claim 14 wherein:
the patterned positive photoresist layer is formed of a polymethylmethacrylate (PMMA) photoresist material; and
the solvent is an aqueous ethanolamine solvent.

26. A method for stripping a patterned photoresist layer comprising:
providing a substrate;
forming over the substrate a target layer;
forming upon the target layer a patterned positive photoresist layer; the positive photoresist layer is a material selected from the group consisting of novolak positive photoresist material and polymethylmethacrylate (PMMA) positive photoresist material;
processing the target layer while employing the patterned positive photoresist layer as a mask layer to thus form from the target layer a processed target layer and to form from the patterned positive photoresist layer a processed patterned positive photoresist layer;
photoexposing the processed patterned positive photoresist layer to form a photoexposed processed patterned positive photoresist layer with enhanced solubility of the photoexposed processed patterned positive photoresist layer within a solvent;
stripping from the processed target layer the photoexposed processed patterned positive photoresist layer while employing the solvent; the solvent being selected from the group comprising acetone, NMP, THF, a photoresist developer solution having a TMAH component, and an aqueous ethanolamine based photoresist stripper solution and
treating the structure with an oxygen containing plasma stripper after the solvent stripping step to provide optimal surface cleanliness; the oxygen containing plasma stripping step employing a reactor chamber pressure of from about 0.1 to about 100 Torr; a radio frequency power of from about 500 to about 3000 watts at a radio frequency of 13.56 MHz; a substrate temperature of from about 100 to about 300° C.; and an oxygen flow rate of from about 500 to about 5000 sccm treating an eight inch diameter substrate.

27. The method of claim 26, wherein the positive photoresist material includes a diazo material photoreactive agent Compound I of FIG. 9 that forms a diradical Compound II of FIG. 9 upon the photoexposing step of the processed patterned positive photoresist layer and rearranges to form Compound III of FIG. 9 plus $N_2$; and the Compound III of FIG. 9, upon hydrolysis, forms the carboxylic acid Compound IV of FIG. 9.

28. The method of claim 26, wherein the solvent is selected from the group consisting of a photoresist stripper solution and a photoresist developer solution.

29. The method of claim 26, wherein the solvent is selected from the group consisting of acetone, NMP, THF, and a photoresist developer solution having a TMAH component.

30. The method of claim 26, wherein the photoexposed processed patterned positive photoresist layer stripping step employs an aqueous ethanolamine based photoresist stripper solution at a temperature from about 5 to 50° C. for from about 1 to 3 minutes immersion time.

31. The method of claim 26 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

32. The method of claim 26 wherein the target layer is formed from a material selected from the group consisting of conductor materials, semiconductor materials and dielectric materials.

33. The method of claim 26 wherein:
the target layer is processed employing a processing method selected from the group consisting of plasma etch processing methods and ion implant processing methods; and
the processed patterned positive photoresist layer is selected from the corresponding group consisting of plasma etch processed patterned positive photoresist layers and ion implant processed patterned positive photoresist layers.

34. The method of claim 26 wherein:
the patterned positive photoresist layer is formed of a polymethylmethacrylate (PMMA) photoresist material; and
the solvent is an aqueous ethanolamine solvent.

* * * * *